United States Patent
Yasuda et al.

(10) Patent No.: US 7,737,421 B2
(45) Date of Patent: Jun. 15, 2010

(54) ELECTRON BEAM EXPOSURE APPARATUS AND METHOD FOR CLEANING THE SAME

(75) Inventors: Hiroshi Yasuda, Tokyo (JP); Yoshihisa Ooae, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 12/077,153

(22) Filed: Mar. 17, 2008

(65) Prior Publication Data

US 2008/0169433 A1 Jul. 17, 2008

Related U.S. Application Data

(63) Continuation of application No. PCT/JP2006/316951, filed on Aug. 29, 2006.

(30) Foreign Application Priority Data

Sep. 26, 2005 (JP) .............................. 2005-278464

(51) Int. Cl.
*G03B 27/42* (2006.01)
*G03B 27/54* (2006.01)

(52) U.S. Cl. .............................. 250/492.22; 250/492.1; 250/492.2; 134/1.1; 134/39; 355/53; 355/67; 355/68

(58) Field of Classification Search ........................ None
See application file for complete search history.

(56) References Cited

U.S. PATENT DOCUMENTS

| 5,312,519 A | * | 5/1994 | Sakai et al. ................... 134/1.1 |
| 5,981,960 A | | 11/1999 | Ooaeh et al. |

FOREIGN PATENT DOCUMENTS

| JP | 61-059826 | 3/1986 |
| JP | 09-259811 | 10/1997 |
| JP | 2000-090868 | 3/2000 |
| JP | 2000-231897 | 8/2000 |
| JP | 2004-014960 | 1/2004 |

* cited by examiner

*Primary Examiner*—David A Vanore
(74) *Attorney, Agent, or Firm*—Muramatsu & Associates

(57) ABSTRACT

Provided is an electron beam exposure apparatus for forming a desired pattern on a sample mounted on a wafer stage by exposure with an electron beam generated form an electron gun. The electron beam exposure apparatus includes: supplying device of injecting a reducing gas into a column in which the electron gun and the wafer stage are housed; and control unit of performing control so that the injection of the reducing gas into the column is continued for a predetermined period of time. Organic contamination is combined with H generated from the reducing gas by irradiation of an electron beam, and then evaporates. Further included is supplying device of injecting an ozone gas into the column. The control unit may perform control so that the injection of the ozone gas into the column in addition to the injection of the reducing gas is continued for a predetermined period of time.

8 Claims, 6 Drawing Sheets

ELECTRON BEAM EXPOSURE APPARATUS AND METHOD FOR CLEANING THE SAME

CROSS-REFERENCE TO RELATED APPLICATIONS

This application is a continuation of prior International Patent Application No. PCT/JP2006/316951, filed Aug. 29, 2006, the entire contents of which are incorporated herein by reference.

BACKGROUND OF THE INVENTION

1. Field of the Invention

The present invention related to an electron beam exposure apparatus. In particular, the present invention relates to an electron beam exposure apparatus, in which generation of contamination inside the apparatus can be suppressed, and to a method for cleaning the electron beam exposure apparatus.

2. Description of the Prior Art

In processes of manufacturing a semiconductor device, an electron beam exposure apparatus capable of exposing a fine pattern is used. In a recent electron beam exposure apparatus, in order to improve throughput, there is used a mask that has a slit or a group of various kinds of opening patterns, for forming various shapes of cross-sections of beam. Then, the electron beam passed through these masks is irradiated onto a surface of a sample.

When exposure is carried out with such an electron beam exposure apparatus, the position of irradiating the electron beam changes with elapse of time. Consequently, the change leads to a phenomenon that an exposure pattern is deteriorated. Such displacement of irradiation position of the electron beam is referred to as beam drift. It is considered that the beam drift is caused as follows.

When an electron beam is irradiated onto a resist film applied to a surface of a sample, an organic material forming the resist film generates a gas.

Carbon components contained in the generated gas adhere onto a surface of each part inside the exposure apparatus to form contamination. In addition, the vacuumed exposure apparatus contains hydrocarbon ($C_xH_x$) therein, and this hydrocarbon also forms contamination. When electric charges are accumulated on this contamination, an electric field is generated by a difference of the amounts of accumulated electric charges. This electric field deflects the electron beam to be irradiated. As a result, the irradiation position of the electron beam varies.

For such a problem, there have been proposed various methods for reducing the generation of contamination inside the electron beam exposure apparatus.

As a technique with regard to this, Japanese Patent Application Laid-open Publication No. 09-259811 discloses a method for cleaning the inside of a chamber by using ozone in an electron beam exposure apparatus.

In the above-described method for preventing the generation of contamination inside the chamber, the generation of contamination is prevented by injecting ozone into the apparatus with the apparatus being operated. In other words, ozone is caused to collide with an electron beam inside the apparatus to be decomposed into oxygen and active oxygen. After that, the active oxygen generated through the decomposition reacts with the contamination which would otherwise adhere to the sample and the surface of each part inside the apparatus, and then evaporates the reaction product as a carbon monoxide gas.

However, it was observed that even if the inside of the exposure apparatus was cleaned by the above-described cleaning method, beam drift was still generated.

As described above, the reason for causing the beam drift is that electric charges are accumulated on the contamination, and an electric field is generated. On the other hand, the reason for causing the beam drift even after the contamination is removed is that an insulator, which is different from the contamination, is generated by injecting an ozone gas into the chamber.

The insulator includes $SiO_2$, which is formed, for example, due to oxidation, by the ozone gas, of silicon constituting a mask for forming an electron beam.

As a countermeasure against this problem, it is also possible that a metal, which does not become an insulator even after being oxidized, such as titanium, is attached to the surface of the mask. However, in this case, an oxide of the attached metal is formed which causes deformation of the mask per se. As a result, it becomes difficult to accurately carry out the exposure process.

SUMMARY OF THE INVENTION

The present invention has been made in view of the foregoing problem of the conventional art. Accordingly, an object of the present invention is to provide: an electron beam exposure apparatus capable of suppressing the generation of contamination, and also of suppressing the generation of beam drift; and a method for cleaning the electron beam exposure apparatus.

The above-described problem is solved by an electron beam exposure apparatus capable of forming a desired pattern on a sample mounted on a wafer stage by exposure with an electron beam generated from an electron gun. The electron beam exposure apparatus is characterized by including: a supplying device for injecting a reducing gas into a column in which the electron gun and the wafer stage are housed; and a control unit for performing control so that the injection of the reducing gas into the column is continued for a predetermined period of time.

The electron beam exposure apparatus according to the above-described embodiment may further include a supplying device for injecting an ozone gas into the column. Furthermore, the control unit may perform control so that the injection of the ozone gas into the column in addition to the injection of the reducing gas is continued for a predetermined period of time.

In addition, in the electron beam exposure apparatus according to the above-described embodiment, the reducing gas may be any one of ammonia gas, hydrogen, and hydrazine ($N_2H_4$).

Furthermore, the above-described problem is also solved by a method for cleaning an electron beam exposure apparatus. The cleaning method is characterized by including a step of injecting a reducing gas into a column of the electron beam exposure apparatus, the column housing an electron gun and a wafer stage.

In the method for cleaning an electron beam exposure apparatus according to the above-described embodiment, a step of injecting an ozone gas may be included in addition to the step of injecting the reducing gas.

In the present invention, the ozone gas and reducing gas (for example, ammonia gas) are injected into the electron beam exposure apparatus. By injecting the ozone gas, active oxygen decomposed from ozone reacts with a causative substance of contamination, and thus contamination, such as carbon, can be removed. Thereby, it is made possible that the adhesion of contamination, such as carbon, onto the sample is suppressed.

In addition, by injecting the reducing gas, hydrogen decomposed from the reducing gas reacts with a causative substance of contamination, and thus contamination, such as carbon, can be removed.

Furthermore, if the reducing gas and ozone gas are injected at the same time into the column, hydrogen decomposed from the reducing gas reacts with oxygen decomposed from ozone to evaporate. Thus, the formation of silicon oxide due to the reaction of oxygen and silicon can be suppressed. Thereby, it is made possible that beam drift caused by charge-up of the silicon oxide is prevented, and thus exposure processing is stably carried out.

DESCRIPTION OF THE PREFERRED EMBODIMENTS

Figure 1:
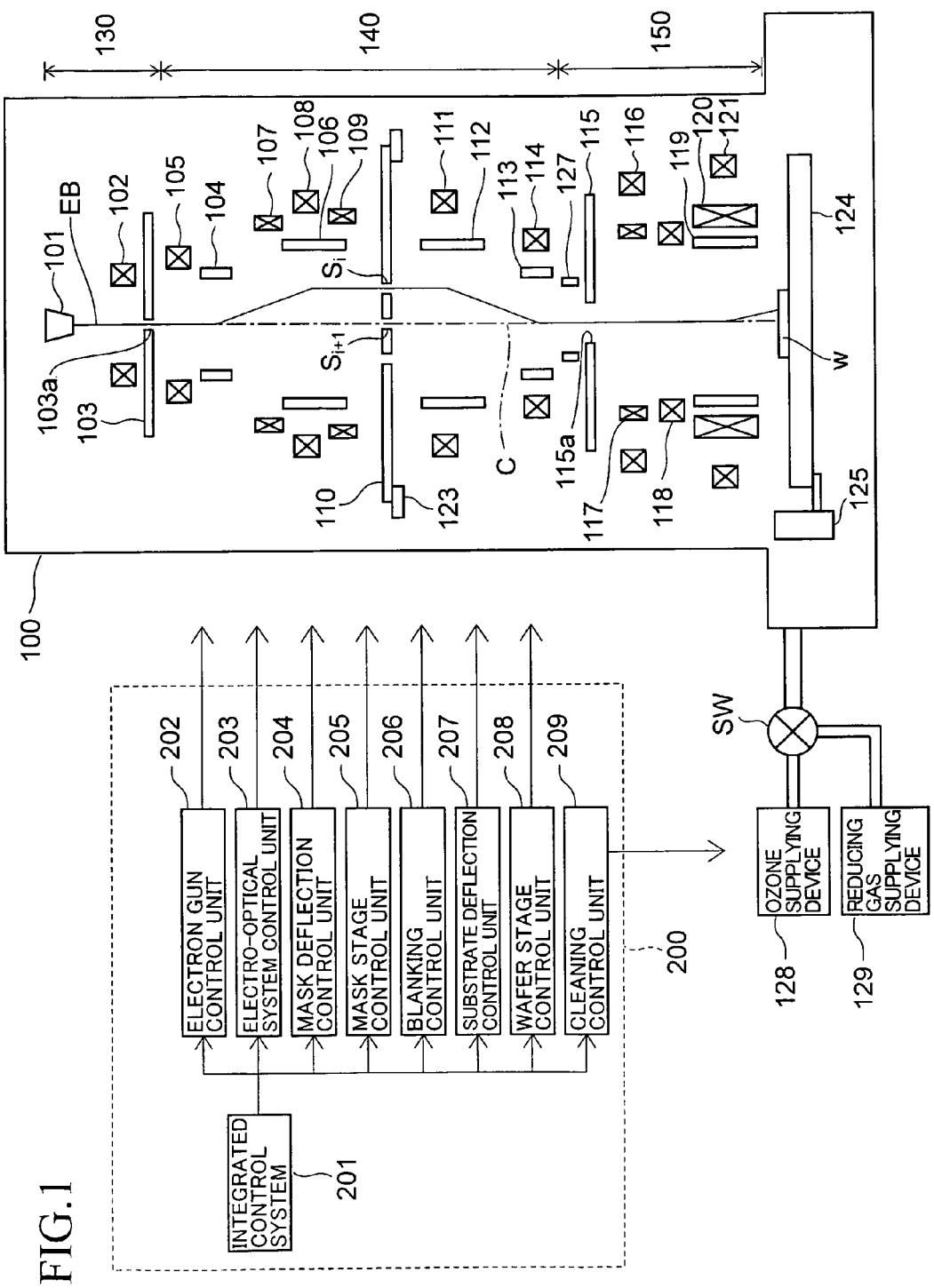
FIG. 1 is a configuration diagram of an electron beam exposure apparatus used in the present embodiment of the present invention.

The preferred embodiment of the present invention will be described by referring to the drawings.

Firstly, the configuration of an electron beam exposure apparatus will be described. Subsequently, the description will be given regarding the processing of removing contamination and suppressing generation of charge-up, which characterizes the present invention. Then, a cleaning method of an electron beam exposure apparatus will be described.

(Configuration of the Electron Beam Exposure Apparatus)

FIG. 1 shows a configuration diagram of an electron beam exposure apparatus according to the present embodiment.

This electron beam exposure apparatus is broadly divided into an electron-optical system column 100 and a control unit 200 which controls each unit of the electron-optical system column 100. The electron-optical system column 100 includes an electron beam generation unit 130, a mask deflection unit 140, and a substrate deflection unit 150. The inside of the electro-optical system column 100 is decompressed. In addition, to the electron-optical system 100 (hereinafter simply referred to as a column), an ozone supplying device 128 and a reducing gas supplying device 129 are connected through an switching device SW.

In the electron beam generation unit 130, an electron beam EB generated in an electron gun 101 is converged in a first electromagnetic lens 102. Thereafter, the electron beam EB passes through a rectangular aperture 103a of a beam-shaping mask 103. Thereby, the cross section of the electron beam EB is shaped into a rectangular shape.

After that, an image of the electron beam EB is formed onto an exposure mask 110 by a second electromagnetic lens 105 of the mask deflection unit 140. Then, the electron beam EB is deflected by first and second electrostatic deflectors 104 and 106 to a specific pattern S formed on the exposure mask 110, and the cross-sectional shape thereof is shaped into the shape of the pattern S.

Note that the exposure mask 110 is fixed to a mask stage 123, but the mask stage 123 is movable in a horizontal plane. Accordingly, in a case where there is used a pattern S that lies over a region exceeding the deflection range (beam deflection region) of the first and second electrostatic deflectors 104 and 106, the pattern S is moved to the inside of the beam deflection region by moving the mask stage 123.

Third and fourth electromagnetic lenses 108 and 111, which are respectively disposed over and under the exposure mask 110, have the role of forming an image of the electron beam EB onto a substrate W by adjusting the amounts of currents flowing therethrough.

The electron beam EB passed through the exposure mask 110 is returned to an optical axis C by the deflection operations of the third and fourth electrostatic deflectors 112 and 113. Thereafter, the size of the electron beam EB is reduced by a fifth electromagnetic lens 114.

In the mask deflection unit 140, first and second correction coils 107 and 109 are provided. These correction coils 107 and 109 correct beam deflection aberration generated in the first to fourth electrostatic deflectors 104, 106, 112, and 113.

After that, the electron beam EB passes through an aperture 115a of a shield plate 115 configuring the substrate deflection unit 150. Then, the electron beam EB is projected onto the substrate W by first and second projection electromagnetic lenses 116 and 121. Thereby, an image of the pattern of the exposure mask 110 is transferred onto the substrate W at a predetermined reduction ratio, for example, a reduction ratio of 1/60.

In the substrate deflection unit 150, a fifth electrostatic deflector 119 and an electromagnetic deflector 120 are provided. The electron beam EB is deflected by these deflectors 119 and 120. Then, an image of the pattern of the exposure mask is projected onto a predetermined position on the substrate W.

Furthermore, in the substrate deflection unit 150, third and fourth correction coils 117 and 118 are provided for correcting deflection aberration of the electron beam EB on the substrate W.

The substrate W is fixed to a wafer stage 124, which is movable in horizontal directions by a driving unit 125, such as a motor. The entire surface of the substrate W can be exposed to the electron beam EB by moving the wafer stage 124.

The control unit 200 includes an electron gun control unit 202, an electro-optical system control unit 203, a mask deflection control unit 204, a mask stage control unit 205, a blanking control unit 206, a substrate deflection control unit 207, a wafer stage control unit 208, and a cleaning control unit 209. The electron gun control unit 202 performs control of the electron gun 101 to control the acceleration voltage, beam emission conditions, and the like of the electron beam EB. The electro-optical system control unit 203 controls the amounts of currents flowing into the electromagnetic lenses 102, 105, 108, 111, 114, 116, and 121, to thereby adjust the magnification, focal point, and the like of the electro-optical system column 100 having these electromagnetic lenses. The blanking control unit 206 controls the voltage applied to a blanking electrode 127 to deflect the electron beam EB generated before the start of exposure onto the shield plate 115. Accordingly, the electron beam EB is prevented from being irradiated to the substrate W before exposure.

The substrate deflection control unit 207 controls the voltage applied to the fifth electrostatic deflector 119 and the amount of a current flowing into the electromagnetic deflector 120 so that the electron beam EB would be deflected onto a predetermined position on the substrate W. The wafer stage control unit 208 moves the substrate W in horizontal directions by adjusting the driving amount of the driving unit 125, so that the electron beam EB would be irradiated to a desired position on the substrate W.

The cleaning control unit 209 controls the ozone supplying device 128 and the reducing gas supplying device 129 to control the supplying amounts and the supplying time of an ozone gas and a reducing gas into the column. The above-described units 202 to 209 are integrally controlled by an integrated control system 201, such as a workstation.

In the electron beam exposure apparatus configured as described above, cleaning of the inside of the column 100 and exposure processing are carried out at the same time. The cleaning of the inside of the column 100 is carried out by injecting only a reducing gas, or both a reducing gas and an ozone gas into the column 100.

The cleaning control unit 209 controls a switch SW so that an ozone gas would be generated by an ozone supplying device 128, for example, an ozonizer, and injected into the column 100. In addition, the cleaning control unit 209 controls a switch SW so that a reducing gas, for example, ammonia gas would be generated by a reducing gas supplying device 127 and injected into the column 100. Note that the ammonia gas may be generated from ammonia water. The time and amount of injecting the reducing gas or ozone gas into the column 100 are fixed in advance and managed by the cleaning control unit 209.

(Description of the Processing of Suppressing Generation of Contamination and Charge-Up)

As described above, the inside of the column 100 can be cleaned by injecting the ozone gas and reducing ammonia gas into the column 100. The reason that the generation of contamination and charge-up can be suppressed by the injection of these gases will be described below.

Here, (1) the case where only a reducing gas is injected into the column 100 and (2) the case where both of a reducing gas and an ozone gas are injected into the column 100 will be described.

(1) The Case where Only a Reducing Gas is Injected into the Column

In a conventional cleaning method, a causative substance of contamination is excluded by injecting an ozone gas into the column 100.

However, it has been made apparent that the following disadvantages are caused due to oxidation effects of the ozone gas even if contamination is excluded by injecting the ozone gas.

Figure 2A:
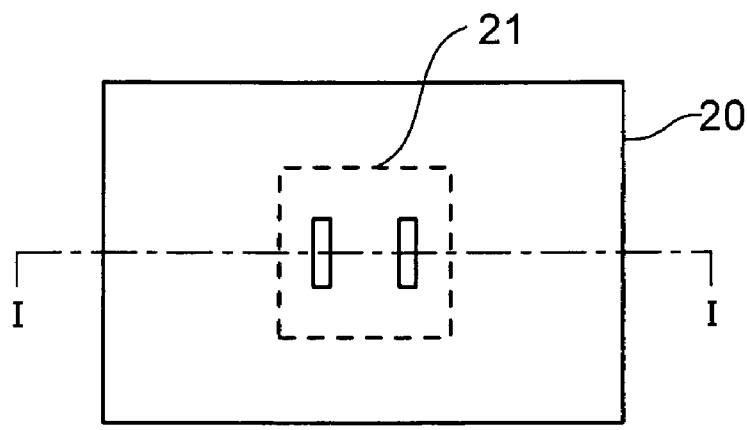
FIGS. 2A and 2B are cross-sectional views, showing one example of a mask.
Figure 2B:
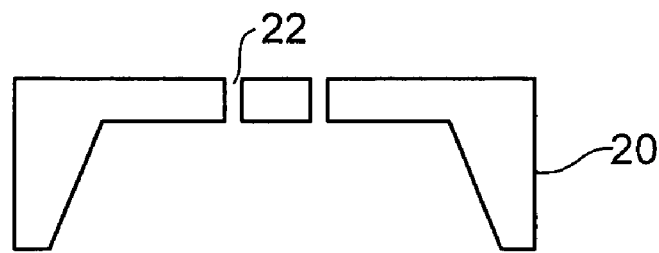

FIG. 2A is a plan view showing one example of a mask forming an electron beam, while FIG. 2B is a cross-sectional view seen from I-I line of FIG. 2A.

For illustration, as shown in FIG. 2A, the mask has two mask patterns 21. In general, the mask 20 is formed of silicon. The thickness of a mask substrate in a vicinity of an opening 22 is 20 μm.

Figure 3A:
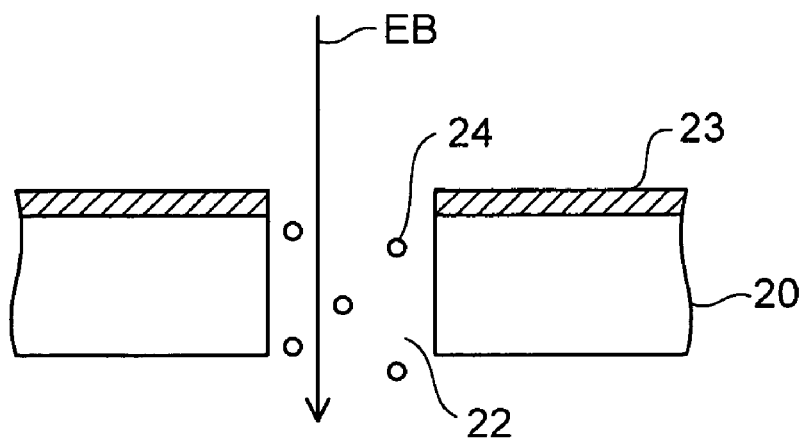
FIGS. 3A and 3B are cross-sectional views illustrating that an oxidation film is formed in an opening of the mask.

FIG. 3A shows an enlarged cross-sectional view of the vicinity of the opening 22. On a side of the mask 20 from which the electron beam enters, a metal film 23 made of, for example Pt, is formed in order to prevent charge-up. Silicon configuring the mask 20 is exposed at an inner side of the opening 22.

Figure 3B:
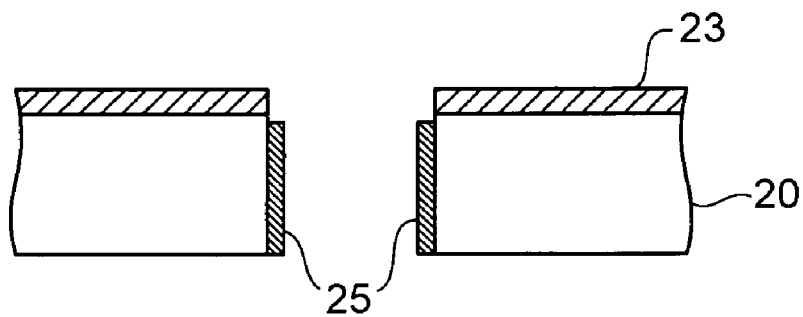

In the column with the above-described configuration, the metal film is not formed on the inner side of the opening 22. Consequently, when the column is cleaned by using the ozone gas in order to remove contamination, silicon is oxidized by the reaction of silicon and ozone 24. As a result, as shown in FIG. 3B, a silicon oxide film 25 is formed on the inner side of the opening 22 on which silicon is exposed.

When an electron beam is irradiated in such a state, electric charges are accumulated on this silicon oxidation film 25 to cause charge-up. This charge-up causes beam drift.

To prevent this, in the present embodiment, a reducing gas, for example, ammonia gas is used.

When a small amount of the ammonia gas is injected into the column 100, molecules of the ammonia gas adhere onto various parts inside of the column 100. When an electron beam is irradiated in such a state, electrons hit the adhered molecules of the ammonia gas to decompose the ammonia gas into $NH_2$ and H. The organic contamination is combined with H decomposed from the ammonia gas to be $CH_2$ or $CH_4$ (methane) and then evaporates.

Consequently, the contamination is detached from the sample or the like, and cleaning of the inside of the column is carried out. In this manner, since the reducing gas is used, silicon is not oxidized, and thus an oxidation film is not formed on the mask formed of silicon. Accordingly, charge-up is not caused on the silicon mask. In addition, the organic contamination, such as carbon, is reduced and evaporates. Furthermore, an oxidation film is not formed on each part inside the column in addition to not being formed on the silicon mask, and thus charge-up is not caused. Accordingly, beam drift is not caused and exposure can be accurately carried out.

(2) The Case where a Reducing Gas and an Ozone Gas are Injected into the Column

As described above, by injecting a reducing gas alone into the column 100 makes it possible to carry out in-situ cleaning, with a mask and parts being still attached, and to thereby remove contamination inside the column 100.

However, in the case where a large amount of organic to be a causative substance of contamination is present inside the column, not only a reducing gas but also an ozone gas are introduced. Thereby, contamination inside the column 100 can be effectively removed.

Firstly, the reason that the ozone gas removes contamination will be described.

Figure 4A:
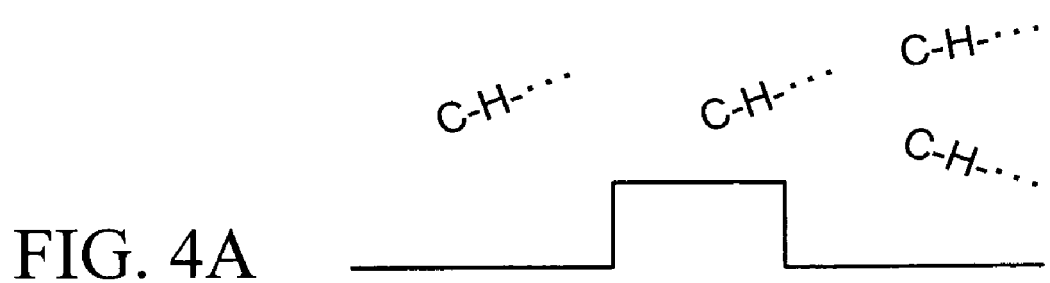
FIGS. 4A and 4B are views illustrating the principle of how to suppress contamination.
Figure 4B:
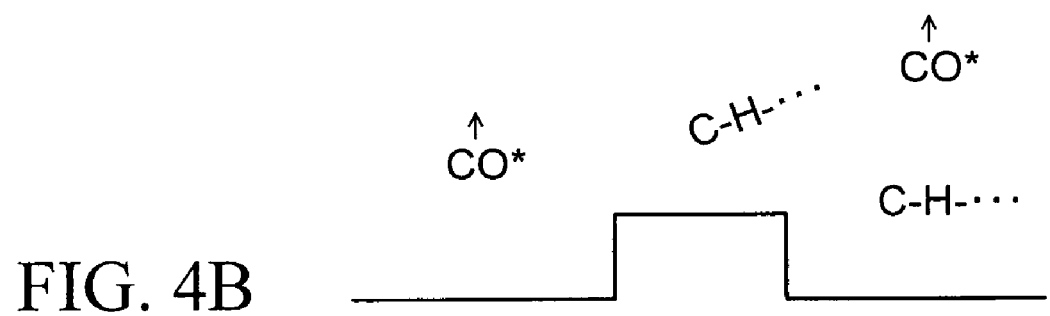

The substances to be a cause of contamination generated by irradiation of electron beam are considered to be organic substances formed of C and H. FIG. 4A is a view schematically showing that such organic substances are present on a sample. The causative substances of contamination are reacted with active oxygen so that C and H of the organic substances are combined with the active oxygen, and are evaporated. Consequently, as shown in FIG. 4B, C, which is considered as a contamination substance, disappears from the surface of the sample. Accordingly, even if the electron beam is irradiated onto the sample, the adhesion of C onto the sample is suppressed.

In order to generate active oxygen, an ozone gas is injected into the column 100. Since ozone is an unstable substance, it is decomposed into oxygen and active oxygen with time. Consequently, active oxygen is generated so that C can be removed from the causative substance of contamination.

As the case where both of the ozone gas and the reducing gas are injected into the column 100, there are cases where the ozone gas and the reducing gas are injected at the same time and where the ozone gas and the reducing gas are alternately injected.

In the case where the oxygen gas and the reducing gas are injected at the same time, oxygen decomposed from the ozone gas is combined with hydrogen decomposed from the reducing gas, and then evaporates. Accordingly, there is an advantage that silicon is prevented from being oxidized by the ozone gas.

On the other hand, in the case where the reducing gas and the ozone gas are alternately injected, contamination can be removed by both of the ozone gas and the reducing gas. Accordingly, the generation of contamination can be effectively prevented. In addition, when a gas to be injected into the column 100 is changed, the gas residual inside the column 100 and the injected gas are reacted. Accordingly, the effects of removing contamination by the ozone gas are decreased. However, the parts inside the column 100 can be prevented from being oxidized by ozone.

In the case where the ozone gas and the reducing gas are injected into the column 100, both of the gases may be injected during exposure, or gas injection may be stopped by the cleaning control unit 209 according to a preset time. In addition, the gas injection may be stopped when the contamination inside the column 100 are determined to be disappeared. Furthermore, only the reducing gas may be injected in the case where the amount of the organic substance inside the column 100 becomes small.

In the case where the ozone gas and the reducing gas are alternately injected into the column 100, times of injection of the ozone gas and reducing gas may be determined depending on the amounts of the organic substances inside the column 100.

As described above, the reducing gas or the ozone gas is injected into the column 100, so that contamination can be removed, and that each part without oxidation resistance in the column 100, such as a mask formed of silicon, can be prevented from being oxidized.

In addition, since the oxidation of silicon is suppressed, the formation of an oxidation film on the mask formed of silicon is also suppressed. Accordingly, beam drift can be prevented, and exposure processing can be accurately carried out.

(Cleaning Method of the Electron Beam Exposure System)

Figure 5:
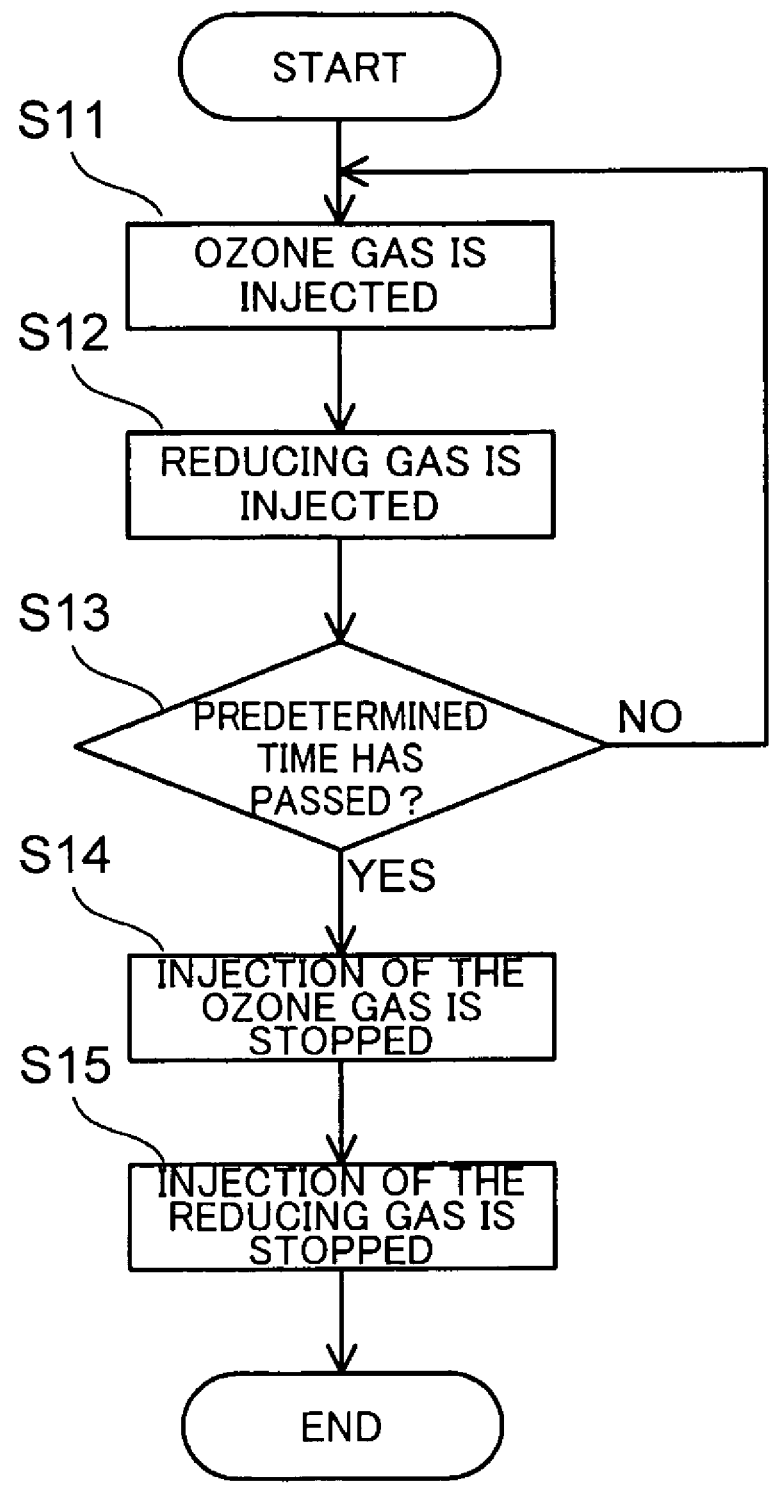
FIG. 5 is a flowchart (No. 1) showing a method for cleaning an electron beam exposure apparatus.

Next, a cleaning method of the electron beam exposure apparatus according to the present embodiment will be described by referring to the flowchart in FIG. 5. Here, it is assumed that contamination due to an organic substance is caused inside the column 100. It is also assumed that the amounts of a reducing gas and an ozone gas to be injected are fixed in advance.

Firstly, at step S11, an ozone gas is injected into the column 100. By injecting the ozone gas, active oxygen formed by decomposition of ozone reacts with a causative substance of contamination to form carbon monoxide to be evaporated.

Next, at step S12, a reducing gas is injected into the column 100. Here, ammonia gas is used as the reducing gas. For example, the extent of a few cc of the ammonia gas is injected for one minute so that the degree of vacuum inside the column 100 would be $10^{-4}$ pascal or less. By injecting the ammonia gas into the column 100, hydrogen formed by decomposition of the ammonia gas reacts with a causative substance of contamination to form $CH_2$ and $CH_4$ to be evaporated.

After this step S12, the ammonia gas and the ozone gas are mixed in the column 100. Accordingly, if an ozone gas, which is not attributable to removal of contamination, is present, it is reduced by hydrogen decomposed from the ammonia gas. Consequently, the oxidation of each part without oxidation resistance in the column 100 can be suppressed.

Next, at step S13, it is determined whether or not a predetermined time has passed since the ozone gas is injected. This predetermined time is determined along with the exposure time if the ammonia gas and the ozone gas are continuously injected to the column 100 during exposure. Also, it may be determined whether or not gas injection is continued by determining whether or not contamination inside the column 100 is sufficiently removed.

When the predetermined time has passed, the step proceeds to step S14. When the predetermined time has not passed, on the other hand, the step returns to step S11 to continue the cleaning of the inside of the column 100.

At subsequent step S14, the injection of the ozone gas is stopped. At step S15, the injection of the reducing gas is stopped. Then, the cleaning processing is finished.

Figure 6:
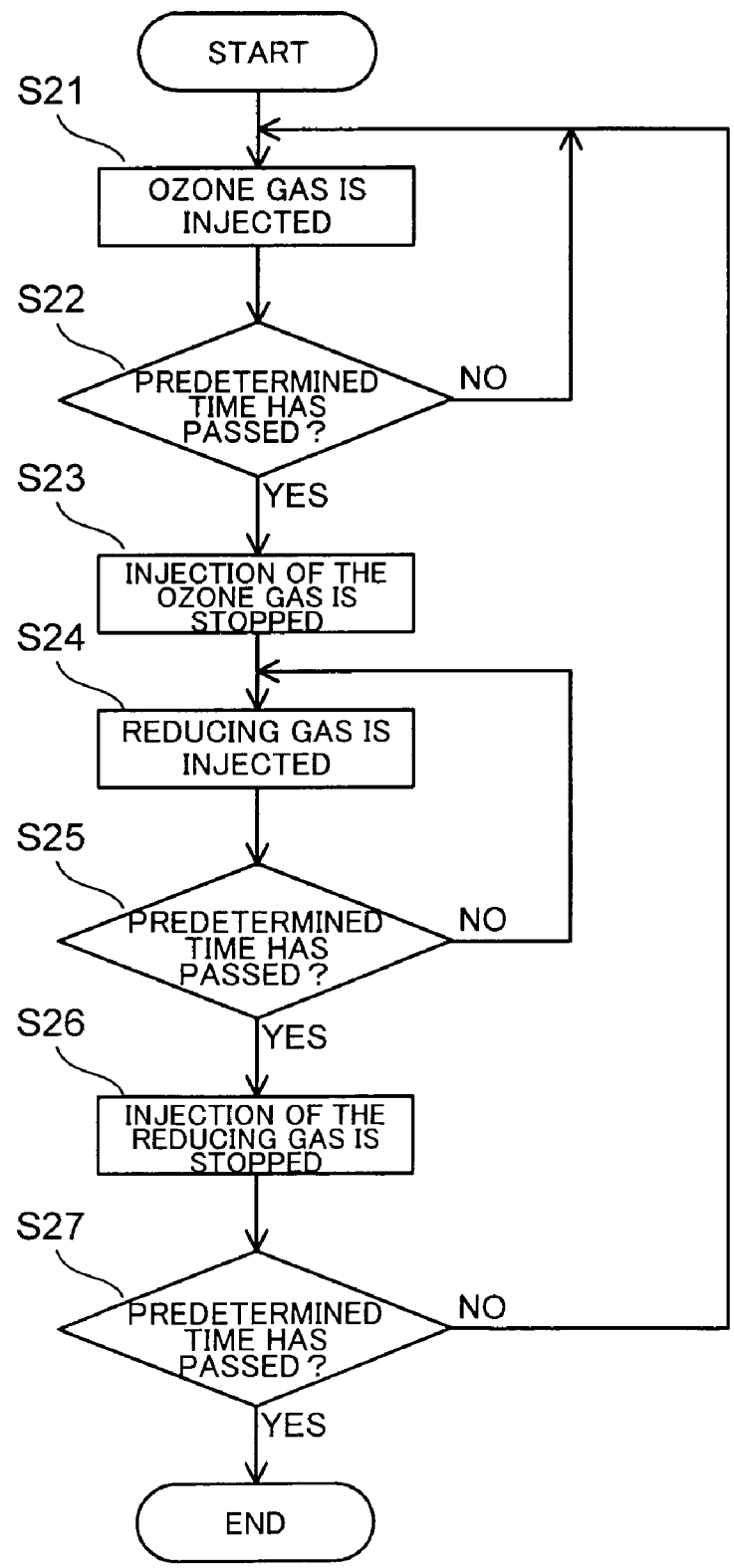
FIG. 6 is a flowchart (No. 2) showing another method for cleaning an electron beam exposure apparatus.

FIG. 6 is a flowchart showing one example of alternately injecting a reducing gas and an ozone gas into the column 100.

Firstly, at step S21, an ozone gas is injected into the column 100. The cleaning control unit 209 controls the switch SW so that a gas generated by an ozone gas supplying device 128 is injected into the column 100.

Subsequently, at step S22, it is determined whether or not a predetermined time has passed since the ozone gas is injected into the column 100. When the predetermined time has passed, at subsequent step S23, the injection of the ozone gas into the column 100 is stopped. This predetermined time may be set longer than a time of injecting the ammonia gas in a case where a large amount of organic substance is present in the column 100 (for example, the case where a new part is housed inside of the column 100).

Next, at step S24, a reducing gas is injected into the column 100. Here, ammonia gas is used as the reducing gas. As in the case with the step S12 of FIG. 5, the ammonia gas is injected into the column 100 so as to remove contamination.

Thereafter, at step S25, it is determined whether or not a predetermined time has passed since the ammonia gas is injected into the column 100. When the predetermined time has passed, the injection of the ammonia gas into the column 100 is stopped at subsequent step S26.

Then, at step S27, it is determined whether or not a predetermined time has passed since the gas injection was started. In the case where the ammonia gas and the ozone gas are continuously injected into the column 100 during exposure, the time is determined along with the exposure time. In addition, it may be determined whether or not the gas injection is continued by determining whether or not contamination inside the column 100 is sufficiently removed.

When it is determined that the predetermined time has passed, at step S27, the cleaning processing is finished. When it is determined that the predetermined time has not passed, the process returns to step S21, and the ozone gas is injected again to continue the cleaning processing. The cleaning control unit 209 controls the switch SW so that a gas generated by the ozone gas supplying device 128 is injected into the column 100.

In the above-described processing, both of the ozone gas and the ammonia gas are used. However, the injection of the ozone gas may be stopped to inject only the ammonia gas after the amount of the organic substance inside the column 100 becomes small. In addition, the ozone gas may be injected to operate the exposure apparatus only at the beginning of the injection, and thereafter, the exposure apparatus may be operated by only the reducing gas until the exposure apparatus stops.

To remove contamination by use of the ozone gas is effective in the case where a large amount of an organic substance is present. However, the generation of contamination can be sufficiently suppressed only by the ammonia gas in the case where the amount of the organic substance becomes small.

In addition, in the present embodiment, ammonia gas is used as the reducing gas. Another reducing gas, for example, hydrogen or hydrazine, may be used.

As described above, in the cleaning method of the electron beam exposure apparatus of the present embodiment, the ozone gas and the reducing gas are injected into the column 100. Accordingly, if the ozone gas and the reducing gas are injected so as to keep balance between the extents of accumulated contamination and the extents of cleaning, the adhesion of contamination, such as carbon, on the sample can be suppressed. In addition, by injecting the reducing gas, each part without oxidation resistance in the column is not oxidized. Accordingly, an electric field due to charge-up is not caused, and therefore the beam drift can be prevented. Consequently, exposure can be accurately carried out by an electron beam.

What is claimed is:

1. An electron beam exposure apparatus for forming a desired pattern on a sample mounted on a wafer stage by exposure with an electron beam generated by an electron gun, comprising:
   a reducing gas supplying device for injecting a reducing gas without activation into a column in which the electron gun and the wafer stage are housed;
   an ozone gas supplying device for injecting an ozone gas without activation into the column; and
   a control unit for performing control so that the injection of the reducing gas without activation and the ozone gas without activation into the column is continued during exposure processing for a predetermined period of time.

2. The electron beam exposure apparatus according to claim 1, wherein the reducing gas is any one of ammonia gas, hydrogen, and hydrazine.

3. The electron beam exposure apparatus according to claim 1, wherein the control unit performs control so that the injection of the reducing gas and the injection of the ozone gas are carried out at the same time for the predetermined period of time.

4. The electron beam exposure apparatus according to claim 1, wherein the control unit performs control so that the injection of the reducing gas and the injection of the ozone gas are alternately carried out for every predetermined period of time.

5. A method for cleaning an electron beam exposure apparatus, comprising the steps of:
   conducting an electron beam exposure process by irradiating an electron beam on a sample;
   injecting a reducing gas without activation into a column of the electron beam exposure apparatus, the column housing an electron gun and a wafer stage on which the sample is placed;
   injecting an ozone gas without activation into the column of the electron beam exposure apparatus; and
   controlling timings of injecting the gases so that the reducing gas without activation and the ozone gas without activation are injected into the column for a predetermined time period during the electron beam exposure process.

6. The method for cleaning an electron beam exposure apparatus according to claim 5, wherein the reducing gas is any one of ammonia gas, hydrogen, and hydrazine.

7. The method for cleaning an electron beam exposure apparatus according to claim 5, wherein the injection of the reducing gas and the injection of the ozone gas are carried out at the same time for a predetermined period of time.

8. The method for cleaning an electron beam exposure apparatus according to claim 5, wherein the injection of the reducing gas and the injection of the ozone gas are alternately carried out for every predetermined period of time.

* * * * *